(12) United States Patent
Tian

(10) Patent No.: US 9,705,608 B2
(45) Date of Patent: Jul. 11, 2017

(54) METHOD AND SYSTEM FOR INTERFERENCE CANCELLATION OF DATA CHANNEL

(71) Applicants: ZTE Corporation, Guangdong (CN); Sanechips Technology Co., Ltd., Guangdong (CN)

(72) Inventor: Yu Tian, Shenzhen (CN)

(73) Assignees: ZTE Corporation, Shenzhen, Guangdong (CN); Sanechips Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/909,979

(22) PCT Filed: May 28, 2014

(86) PCT No.: PCT/CN2014/078653
§ 371 (c)(1),
(2) Date: Mar. 10, 2016

(87) PCT Pub. No.: WO2014/169881
PCT Pub. Date: Oct. 23, 2014

(65) Prior Publication Data
US 2016/0182159 A1 Jun. 23, 2016

(30) Foreign Application Priority Data
Aug. 14, 2013 (CN) .......................... 2013 1 0354020

(51) Int. Cl.
*H04L 25/08* (2006.01)
*H04B 15/00* (2006.01)
(Continued)

(52) U.S. Cl.
CPC ........ *H04B 15/00* (2013.01); *H03M 13/2792* (2013.01); *H04B 1/7103* (2013.01);
(Continued)

(58) Field of Classification Search
CPC ..... H04B 15/00; H04L 1/0042; H04L 1/0045; H04L 1/0048; H04L 1/10; H04L 1/7097;
(Continued)

(56) References Cited

U.S. PATENT DOCUMENTS 7,050,481 B1 * 5/2006 Hulbert ............... H04B 1/7103
370/342
7,130,365 B2 10/2006 Li
(Continued)

FOREIGN PATENT DOCUMENTS

CN 1283936 A 2/2001
CN 101350800 A 1/2009
(Continued)

OTHER PUBLICATIONS

International Search Report in international application No. PCT/CN2014/078653, mailed on Aug. 27, 2014.
(Continued)

*Primary Examiner* — Siu Lee
(74) *Attorney, Agent, or Firm* — Oppedahl Patent Law Firm LLC

(57) ABSTRACT

The disclosure discloses a method for interference cancellation of a data channel. The method includes that: bit-level channel recoding is performed on received transport block data, and then channel estimation is performed on the coded data and multiplexed antenna data of a data channel to obtain channel estimation data; data channel reconstruction is performed on the coded data with a Reconstruction Unit (RU) as a unit by virtue of the channel estimation data; and obtained reconstruction data is subtracted from the antenna data to implement interference cancellation. The disclosure further discloses a system for interference cancellation of a data channel.

16 Claims, 5 Drawing Sheets

(51) Int. Cl.
*H04L 1/00* (2006.01)
*H03M 13/27* (2006.01)
*H04L 12/861* (2013.01)
*H04B 1/7103* (2011.01)

(52) U.S. Cl.
CPC .......... *H04L 1/0042* (2013.01); *H04L 1/0045* (2013.01); *H04L 1/0048* (2013.01); *H04L 49/90* (2013.01)

(58) Field of Classification Search
CPC ..... H04L 1/715; H04L 49/90; H04L 25/0328; H04L 25/03305; H04L 27/2691; H03M 13/2792
USPC .................................. 375/259, 285, 316, 346
See application file for complete search history.

(56) References Cited

U.S. PATENT DOCUMENTS

| | | | | |
|---|---|---|---|---|
| 7,990,874 | B2* | 8/2011 | del Rio Herrero | H04B 1/71072 370/236 |
| 8,472,877 | B2* | 6/2013 | Hou | H04B 1/7085 455/278.1 |
| 9,071,344 | B2* | 6/2015 | Smee | H04B 1/7107 |
| 2002/0111143 | A1 | 8/2002 | Li | |
| 2006/0141933 | A1 | 6/2006 | Smee | |
| 2010/0158161 | A1 | 6/2010 | Sambhwani | |

FOREIGN PATENT DOCUMENTS

| | | |
|---|---|---|
| CN | 101651900 A | 2/2010 |
| JP | 2008526118 A | 7/2008 |
| JP | 2010537577 A | 12/2010 |
| JP | 2012513724 A | 6/2012 |

OTHER PUBLICATIONS

English Translation of the Written Opinion of the International Search Authority in international application No. PCT/CN2014/078653, mailed on Aug. 27, 2014.

Supplementary European Search Report in European application No. 14785066.3, mailed on Nov. 18, 2016.

* cited by examiner

METHOD AND SYSTEM FOR INTERFERENCE CANCELLATION OF DATA CHANNEL

TECHNICAL FIELD

The disclosure relates to an interference cancellation technology in the field of communication, and in particular to a method and system for interference cancellation of a data channel in Wide-band Code Division Multiple Access (WCDMA).

BACKGROUND

A WCDMA technology refers to propagation of different users with the same frequency point at the same time, and different users are distinguished by different coding; and specifically, each channel is spread by virtue of an Orthogonal Variable Spreading Factor (OVSF) code, and is scrambled by virtue of a scrambling code, and different channels in the same frequency band and timeslot may be distinguished as long as either the OVSF codes or the scrambling codes are different.

Multiple Access Interference (MAI) is a phenomenon of incapability, caused by non-orthogonality of codes, of a receiver in completely eliminating interference of other users; and moreover, MAI is more serious if there are more users. If information bits of a plurality of channels are correctly demodulated to generate waveforms of the plurality of channels in some manners, the waveforms are interference to users who have yet not finished demodulation; and then, a more accurate result may correspondingly be obtained by deleting the interference from all received waveforms and demodulating or re-demodulating clean signals, and such an interference deletion and re-demodulation process is called interference cancellation.

At present, a related technology for interference cancellation of a data channel is only based on local implementation of interference cancellation, and for example: only a reconstruction device for implementing interference cancellation is involved, or only an improvement in an interference cancellation algorithm is involved, or only an application of interference cancellation to a certain aspect is involved, and related researches on the whole flow of channel recoding, channel estimation and channel reconstruction are not involved.

SUMMARY

In view of this, the embodiment of the disclosure is intended to provide a method and system for interference cancellation of a data channel, which may implement optimization of the whole processing flow of interference cancellation of the data channel, thereby improving cancellation efficiency and increasing a resource utilization rate.

The technical solutions of the embodiment of the disclosure are implemented as follows.

The embodiment of the disclosure provides a method for interference cancellation of a data channel, which may include:

bit-level channel recoding is performed on received transport block data, and then channel estimation is performed on the coded data and multiplexed antenna data of a data channel to obtain channel estimation data;

data channel reconstruction is performed on the coded data with a Reconstruction Unit (RU) as a unit by virtue of the channel estimation data; and obtained reconstruction data is subtracted from the antenna data to implement interference cancellation.

In the solution, the method may further include: different frequency offset parameters are transmitted to antennae forming an antenna pair.

In the solution, data channel reconstruction may be implemented as follows: a path with larger energy is preferably selected for reconstruction according to path energy.

In the solution, bit-level channel recoding may include:

the received transport block data is coded to obtain Turbo coded data in a Turbo coding manner; primary First-In First-Out (FIFO) caching is executed on the Turbo coded data; rate matching is performed on the primary cached data, and then secondary FIFO caching is executed; bit collection is performed on the secondary cached data, and then tertiary FIFO caching is executed; and secondary interleaving processing is performed on the tertiary cached data, and the recoded data and interleaving addresses are output.

In the solution, secondary interleaving processing may include:

row-column transform is performed on an interleaving pattern at first, and interleaving addresses where current coded data should be stored are calculated;

the bit-collected data is output, and the data is written into a Random Access Memory (RAM) according to the calculated storage addresses; and when the interleaved data is required, the data stored in the RAM is sequentially read to implement interleaving.

In the solution, the step that channel estimation is performed on the coded data and the multiplexed antenna data of the data channel may include:

a data packet parameter is received, and a request for antenna data is made after the data packet parameter is received; antenna data chip-level processing is performed on the obtained antenna data, and then antenna data symbol-level processing is executed; the processed antenna data of the data channel and the processed antenna data of a control channel are output in parallel; real-time data channel filtering processing is performed on the antenna data of the data channel;

after a complete data packet is received, amplitude offset estimation of the control channel is started, and amplitude offset estimation is started to be executed on the control channel; and after an amplitude offset of the control channel is calculated, a data channel filtering result is read, bit slicing processing is performed to obtain a channel estimation value of the data channel, and the obtained channel estimation value is multiplied by the amplitude offset of the control channel to obtain a channel estimation value of the control channel.

In the solution, when a reconstruction conflict occurs during data channel reconstruction, the method may further include:

after filtered data branching processing is performed on the filtered data, current user data and previous user data are output in two paths, a time delay interval between adjacent two pieces of user data being equal to a length of a data conflict window;

accumulation, overflow and bit slicing processing operation is performed on the current user data, the previous user data and original reconstruction data to obtain reconstruction operation result data; and the reconstruction operation result data is stored, each user occupying an address field space and reconstruction RAM addresses being progressively increase in sequence according to system time.

In the solution, read-write control over the reconstruction RAM may include:

corresponding original reconstruction data is read from a corresponding location of the reconstruction RAM according to system time corresponding to current reconstruction data and a user offset; and reconstruction operation is performed on the data read from the reconstruction RAM, and the updated reconstruction data is transmitted to the corresponding location of the reconstruction RAM to update the old reconstruction result data.

The embodiment of the disclosure further provides a system for interference cancellation of a data channel, which may include: a control module, a bit-level channel recoding module, a data-channel-based channel estimation module and a data channel reconstruction module, wherein the control module may be configured to control the execution modules of each function, and trigger and start the bit-level channel recoding module, the data-channel-based channel estimation module and the data channel reconstruction module when it is necessary;

the bit-level channel recording module may be configured to perform bit-level channel recoding on received transport block data, and send the obtained coded data to the data-channel-based channel estimation module and the data channel reconstruction module;

the data-channel-based channel estimation module may be configured to perform channel estimation on the coded data and multiplexed antenna data of a data channel, and send obtained channel estimation data to the data channel reconstruction module; and the data channel reconstruction module may be configured to perform data channel reconstruction on the coded data with an RU as a unit by virtue of the channel estimation data, and subtract the obtained reconstruction data from the antenna data to implement interference cancellation.

In the solution, the control module may further be configured to transmit different frequency offset parameters to antennae forming an antenna pair.

In the solution, the operation that the data channel reconstruction module performs data channel reconstruction may be implemented as follows: the data channel reconstruction module preferably selects a path with larger energy for reconstruction according to path energy.

In the solution, the bit-level channel recoding module may include: a Turbo coding module, multiple FIFO caches, a rate matching module, a bit collection module and a secondary interleaving module;

the Turbo coding module may be configured to code the received transport block data to obtain Turbo coded data in a Turbo coding manner;

the multiple FIFO caches may be configured to cache the Turbo coded data, cache rate-matched data and cache bit-collected data;

the rate matching module may be configured to match each bit and a transmission channel to confirm whether to repeat or punch;

the bit collection module may be configured to collect coded bit data; and the secondary interleaving module may be configured to perform secondary interleaving processing on the received FIFO cached data, and output the recoded data and interleaving addresses.

In the solution, the secondary interleaving module in the bit-level channel recoding module may be configured to perform row-column transform on an interleaving pattern at first, pre-calculate interleaving addresses where current coded data should be stored, output the bit-collected data, simultaneously write the data into a RAM according to the calculated storage addresses, and sequentially read the RAM to implement interleaving when the interleaved data is required.

In the solution, the data-channel-based channel estimation module may include: an antenna data chip-level processing module, an antenna data symbol-level processing module, a data channel filtering module and a control channel amplitude offset estimation module, wherein the antenna data chip-level processing module may be configured to receive a data packet parameter, request for antenna data after the data packet parameter is received, perform antenna data chip-level processing on the antenna data, and send the antenna data to the antenna data symbol-level processing module;

the antenna data symbol-level processing module may be configured to perform symbol-level processing on the data processed by the antenna data chip-level processing module, and output the processed antenna data of the data channel and the processed antenna data of a control channel in parallel;

the data channel filtering module may be configured to perform real-time data channel filtering processing on the antenna data of the data channel; and the control channel amplitude offset estimation module may be configured to, after a complete data packet is received, start amplitude offset estimation of the control channel, start executing amplitude offset estimation on the control channel, read a data channel filtering result after an amplitude offset of the control channel is calculated, perform bit slicing processing to obtain a channel estimation value of the data channel, and multiply the obtained channel estimation value by the amplitude offset of the control channel to obtain a channel estimation value of the control channel.

In the solution, the data channel reconstruction module may include a reconstruction accumulation module, and the reconstruction accumulation module may include: a filtered data branching processing module, a reconstruction operation processing module and a reconstruction data storage module, wherein the filtered data branching processing module may be configured to receive the filtered data, and output current user data and previous user data in two paths, a time delay interval between adjacent two pieces of user data being equal to a length of a data conflict window;

the reconstruction operation processing module may be configured to execute reconstruction operation, and specifically perform accumulation, overflow and bit slicing processing operation on the current user data, the previous user data and original reconstruction data to obtain reconstruction operation result data; and the reconstruction data storage module may be configured to store the reconstruction operation result data, each user occupying an address field space and reconstruction RAM addresses being progressively increase in sequence according to system time.

In the solution, the reconstruction accumulation module may further include a reconstruction data read-write control module, configured to perform read-write control on the reconstruction RAM;

read-write control over the reconstruction RAM may include: corresponding original reconstruction data is read from a corresponding location of the reconstruction RAM according to system time corresponding to current reconstruction data and a user offset; and then reconstruction operation is performed on the data read from the reconstruction RAM, and the updated reconstruction data is transmitted to the corresponding location of the reconstruction RAM to update the old reconstruction result data.

When the control module, the bit-level channel recoding module, the data-channel-based channel estimation module, the data channel reconstruction module, the Turbo coding module, the multiple FIFO caches, the rate matching module, the bit collection module, the secondary interleaving module, the antenna data chip-level processing module, the antenna data symbol-level processing module, the data channel filtering module, the control channel amplitude offset estimation module, the reconstruction accumulation module, the filtered data branching processing module, the reconstruction operation processing module, the reconstruction data storage module and the reconstruction data read-write control module execute processing, a Central Processing Unit (CPU), a Digital Signal Processor (DSP) or a Field-Programmable Gate Array (FPGA) is adopted for implementation.

According to the method and system for interference cancellation of the data channel provided by the embodiment of the disclosure, the whole interference cancellation flow including bit-level channel recoding, data-channel-based channel estimation and data channel reconstruction for interference cancellation of a WCDMA uplink dedicated data channel is involved, wherein an all-pipeline manner is adopted for a bit-level channel recoding process, so that coding efficiency reaches an optimal theoretical value;

in a data-channel-based channel estimation process, the channel estimation value is calculated on the basis of the antenna data of the data channel, and channel estimation is performed by multiplexing the antenna data of the data channel, so that a utilization rate of a radio resource may be increased, a channel condition may be reflected more accurately, and calculation accuracy may be improved;

in a data reconstruction process, the RU with a reasonable size is employed as a unit for reconstruction processing, and interference cancellation may directly be performed without waiting after an RU is reconstructed, so that cancellation efficiency may be greatly improved; in addition, the antennae forming the antenna pair have different frequency offset parameters, and the two antennae in the antenna pair may be separated, so that limits to the antenna pair are broken in the channel reconstruction process, and the antennae may be arranged in an arbitrary sequence, and are not required to be paired; the path with larger energy is preferably selected for reconstruction according to the path energy in the channel reconstruction process, and a path with energy smaller than specified energy is not reconstructed, so that application scenarios may be expanded, reconstruction cancellation benefits may be improved, and a utilization rate of a hardware resource may also be increased; a method capable of reducing control complexity and chip area cost consumption under the condition of maintaining maximum performance is adopted in the channel reconstruction process, thereby solving the problem of data conflict of adjacent user data during reconstruction operation and further freely determining an antenna reconstruction sequence, and the antenna data here may be considered as an accumulated sum of multiple single-user energy waveforms; and Moreover, an efficient time division multiplexing core operation unit is adopted for each of the three stages of bit-level channel recoding, data-channel-based channel estimation and data channel reconstruction, so that the resource utilization rate is further increased, and cost is lowered.

DETAILED DESCRIPTION

In the embodiment of the disclosure, different frequency offset parameters are transmitted to antennae forming an antenna pair, and a data channel is reconstructed with an RU as a unit; and then obtained reconstruction data is subtracted from antenna data to implement interference cancellation.

Wherein, reconstruction of the data channel is implemented by preferably selecting a path with larger energy for reconstruction according to path energy.

Preferably, all-pipeline bit-level channel recoding is adopted during channel coding, a channel estimation value is calculated on the basis of the antenna data of the data channel during channel estimation, and channel estimation is performed by multiplexing the antenna data of the data channel.

The disclosure will further be described below with reference to the drawings and specific embodiments in detail.

Figure 1:
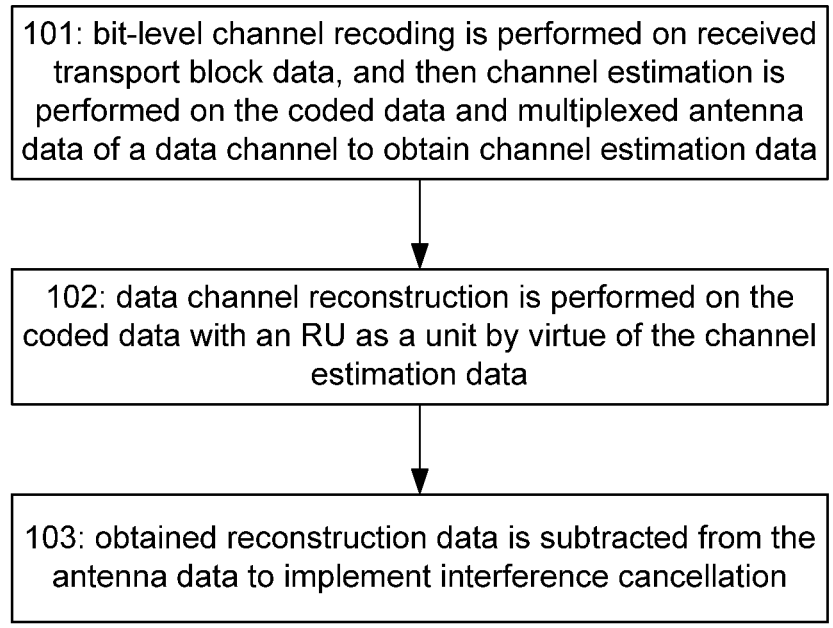
FIG. 1 is a processing flowchart of a method for interference cancellation of data channel according to an embodiment of the disclosure.

FIG. 1 is a processing flowchart of a method for interference cancellation of a data channel according to an embodiment of the disclosure, and as shown in FIG. 1, the method for interference cancellation of the data channel in the embodiment of the disclosure includes the following steps:

Step 101: bit-level channel recoding is performed on received transport block data, and then channel estimation is performed on the coded data and multiplexed antenna data of a data channel to obtain channel estimation data.

Wherein, how to specifically implement bit-level channel recoding belongs to a conventional art, and will not be elaborated herein.

Here, the multiplexed antenna data of the data channel is externally input; the data channel is mainly an Enhanced Dedicated Channel (E-DCH), including: an Enhanced Dedicated Physical Data Channel (EDPDCH) and an Enhanced Dedicated Physical Control Channel (EDPCCH).

Step 102: data channel reconstruction is performed on the coded data with an RU as a unit by virtue of the channel estimation data.

In the step, reconstruction of the data channel is implemented by preferably selecting a path with larger energy for reconstruction according to path energy.

In the embodiment of the disclosure, different frequency offset parameters may be transmitted to antennae forming an antenna pair, so that a single antennae in the antenna pair may belong to different cells, unlike the conventional art where an antenna pair is required to be limited in a specific cell; that is, the two antennae in the antenna pair may be separated in the embodiment of the disclosure, thereby breaking limits to the antenna pair and implementing free arrangement of the antennae;

in the embodiment of the disclosure, data channel reconstruction is performed with the RU as a unit, unlike the conventional art where reconstruction is performed with a user as a unit; wherein, the RU is all user data within a certain time;

for multiple users in multiple user groups, first RUs of each user in a user group are reconstructed, a first RU of the next user is processed after a first UE of one user is reconstructed until all first RUs of a current user group are reconstructed, and interference cancellation may directly be performed without waiting after one RU is reconstructed; then processing of second RUs of each user in the user group is continued until all RUs of all the users in the current user group are processed, and then the next user group is processed; and in such a manner, interference cancellation may directly be performed without waiting after one RU is reconstructed, and low cancellation efficiency caused by sharing of the same segment of antenna data by multiple users during reconstruction processing performed with a user as a unit in a conventional implementation method in the conventional art is avoided.

In the embodiment of the disclosure, data channel reconstruction is implemented by preferably selecting the path with larger energy according to the path energy, and a path with energy smaller than specified energy is not reconstructed, so that reconstruction cancellation benefits may be improved, and a utilization rate of a hardware resource may be increased.

Step 103: obtained reconstruction data is subtracted from the antenna data to implement interference cancellation.

The processing flow shown in FIG. 1 may further include: different frequency offset parameters are transmitted to the antennae forming the antenna pair.

Here, the antenna data is externally input.

Figure 2:
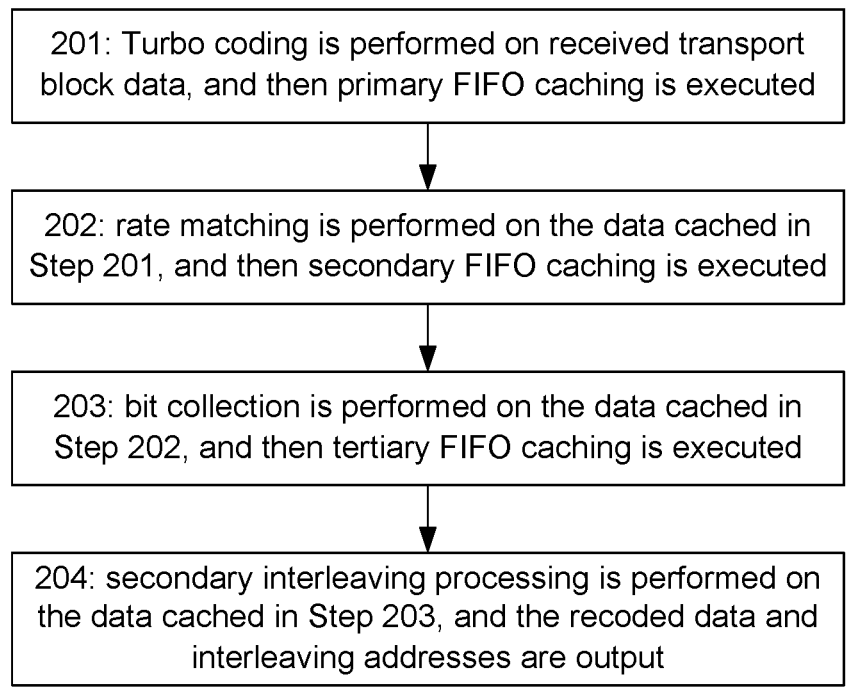
FIG. 2 is a flowchart of bit-level channel recoding processing according to an embodiment of the disclosure.

FIG. 2 is a flowchart of bit-level channel recoding processing according to an embodiment of the disclosure, and as shown in FIG. 2, the bit-level channel recoding processing flow of the embodiment of the disclosure includes the following steps:

Step 201: Turbo coding is performed on the received transport block data, and then primary FIFO caching is executed;

Step 202: rate matching is performed on the data cached in Step 201, and then secondary FIFO caching is executed;

Step 203: bit collection is performed on the data cached in Step 202, and then tertiary FIFO caching is executed; and Step 204: secondary interleaving processing is performed on the data cached in Step 203, and the recoded data and interleaving addresses are output.

In the embodiment of the disclosure, empty and full signals of FIFO caches are utilized for pipeline control in three FIFO caching processes in Step 201 to Step 203, and specifically, the empty and full signals of the FIFO caches are utilized for pipeline control over cache write and read; and from the abovementioned processing process, bit-level channel recoding is mainly divided into four processing stages of Turbo coding, rate matching, bit collection and secondary interleaving, and in the embodiment of the disclosure, complete pipeline operation is adopted in each processing stage, so that a coding rate may be increased, and a coding time delay may be reduced.

Preferably, FIFO caches are adopted between Turbo coding and rate matching, between rate matching and bit collection and between bit collection and secondary interleaving, and the empty and full signals of the FIFO caches are employed as pipeline control signals, so as to improve a degree of coupling between previous-stage and later-stage modules and implement all-pipeline bit-level channel recoding.

Figure 3:
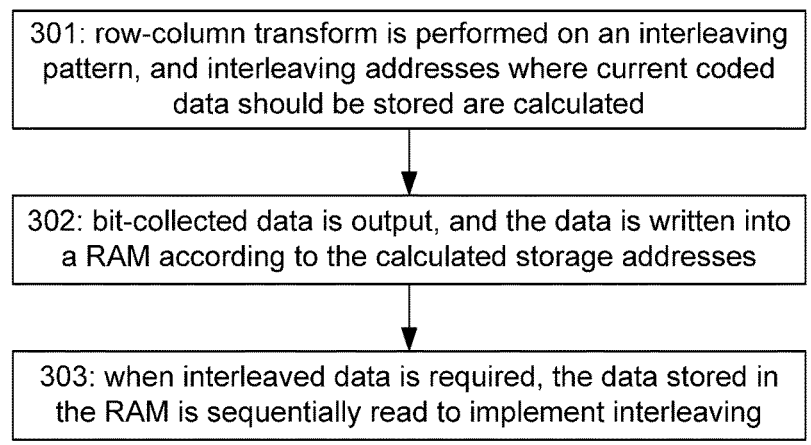
FIG. 3 is a flowchart of secondary interleaving processing according to an embodiment of the disclosure.

FIG. 3 is a flowchart of secondary interleaving processing according to an embodiment of the disclosure, and as shown in FIG. 3, the secondary interleaving processing flow of the embodiment of the disclosure includes the following steps:

Step 301: row-column transform is performed on an interleaving pattern, and interleaving addresses where current coded data should be stored are calculated.

Here, the interleaving patter has existed.

Step 302: the bit-collected data is output, and the data is written into a RAM according to the calculated storage addresses.

Here, the step that the data is written into the RAM according to the calculated storage addresses is implemented as follows: the write addresses are the storage addresses obtained by interleaving calculation, and the data is sequentially written by taking a bit as a unit; and the RAM is located in a secondary interleaving processing module.

Step 303: when the interleaved data is required, the data stored in the RAM is sequentially read to implement interleaving.

Here, the RAM is sequentially read as follows: read addresses progressively increase in sequence, and the data is read by taking 32 bit as a unit.

Figure 4:
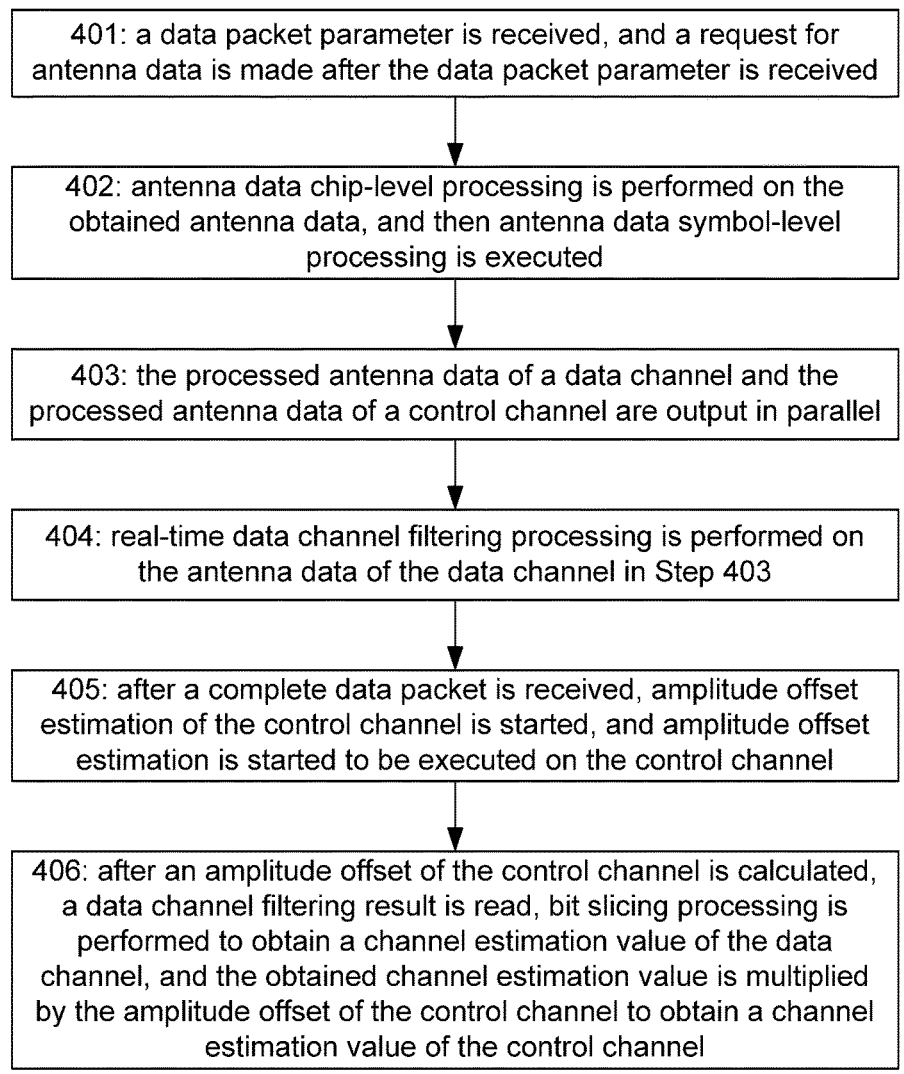
FIG. 4 is a flowchart of data-channel-based channel estimation processing according to an embodiment of the disclosure.

FIG. 4 is a flowchart of data-channel-based channel estimation processing according to an embodiment of the disclosure, and as shown in FIG. 4, the data-channel-based channel estimation processing flow of the embodiment of the disclosure includes the following steps:

Step 401: a data packet parameter is received, and a request for antenna data is made after the data packet parameter is received.

Here, a channel estimation processing module receives various data packet parameters from own upstream module, and then requests for related antenna data from own upstream module after receiving the data packet parameters.

Step 402: antenna data chip-level processing is performed on the obtained antenna data, and then antenna data symbol-level processing is executed.

Here, antenna data chip-level processing refers to calculating an up-sampling point corresponding to the antenna data according to a descrambling and despreading sampling point and then descrambling and dispreading the calculated up-sampling point, and because spreading factors of the data channel and a control channel are different, the antenna data is divided into two paths, i.e. the data channel and the control channel, after descrambling and despreading; and symbol-level processing refers to accumulating the 1 chip antenna data output by chip-level processing to 256 chip level by level, accumulating the output 1 chip antenna data to 2 chip for depolarization processing after finishing accumulation, then accumulating the antenna data to 32 chip for frequency offset compensation and finally accumulating the antenna data to 256 chip for normalization processing to implement the whole symbol-level processing process, wherein the data channel and the control channel are processed in parallel.

In the embodiment of the disclosure, calculating a channel estimation value of the data channel by directly utilizing the antenna data of the data channel may reflect a channel condition more accurately and improve calculation accuracy.

Step 403: the processed antenna data of the data channel and the processed antenna data of a control channel are output in parallel.

Step 404: real-time data channel filtering processing is performed on the antenna data of the data channel in Step 403.

Step 405: after a complete data packet is received, amplitude offset estimation of the control channel is started, and amplitude offset estimation is started to be executed on the control channel.

Step 406: after an amplitude offset of the control channel is calculated, a data channel filtering result is read, bit slicing processing is performed to obtain the channel estimation value of the data channel, and the obtained channel estimation value is multiplied by the amplitude offset of the control channel to obtain a channel estimation value of the control channel.

In the embodiment of the disclosure, processing processes in Step 401 to Step 403 are pre-processing processes during a practical application; and processing processes in Step 404 to Step 406 are post-processing processes during the practical application.

Figure 5:
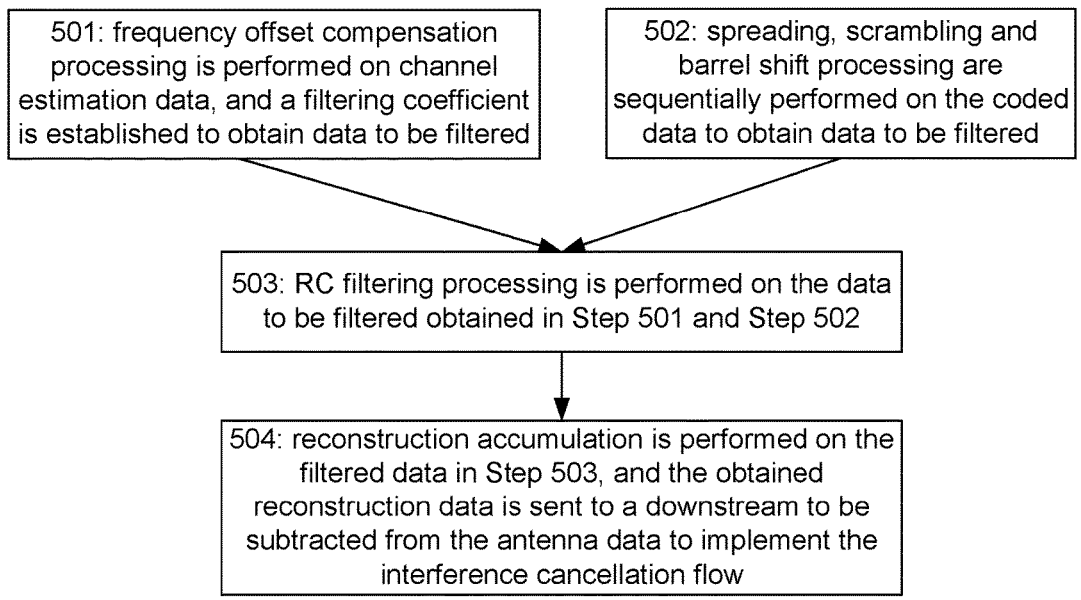
FIG. 5 is a flowchart of data channel reconstruction processing according to an embodiment of the disclosure.

FIG. 5 is a flowchart of data channel reconstruction processing according to an embodiment of the disclosure, and as shown in FIG. 5, the data channel reconstruction processing flow of the embodiment of the disclosure includes the following steps:

Step 501: frequency offset compensation processing is performed on channel estimation data, and a filtering coefficient is established to obtain data to be filtered;

Step 502: spreading, scrambling and barrel shift processing are sequentially performed on the coded data to obtain data to be filtered;

Step 503: Resistance-Capacitance (RC) filtering processing is performed on the data to be filtered obtained in Step 501 and Step 502; and Step 504: reconstruction accumulation is performed on the filtered data in Step 503, and the obtained reconstruction data is sent to a downstream to be subtracted from the antenna data to implement the interference cancellation flow.

Figure 6:
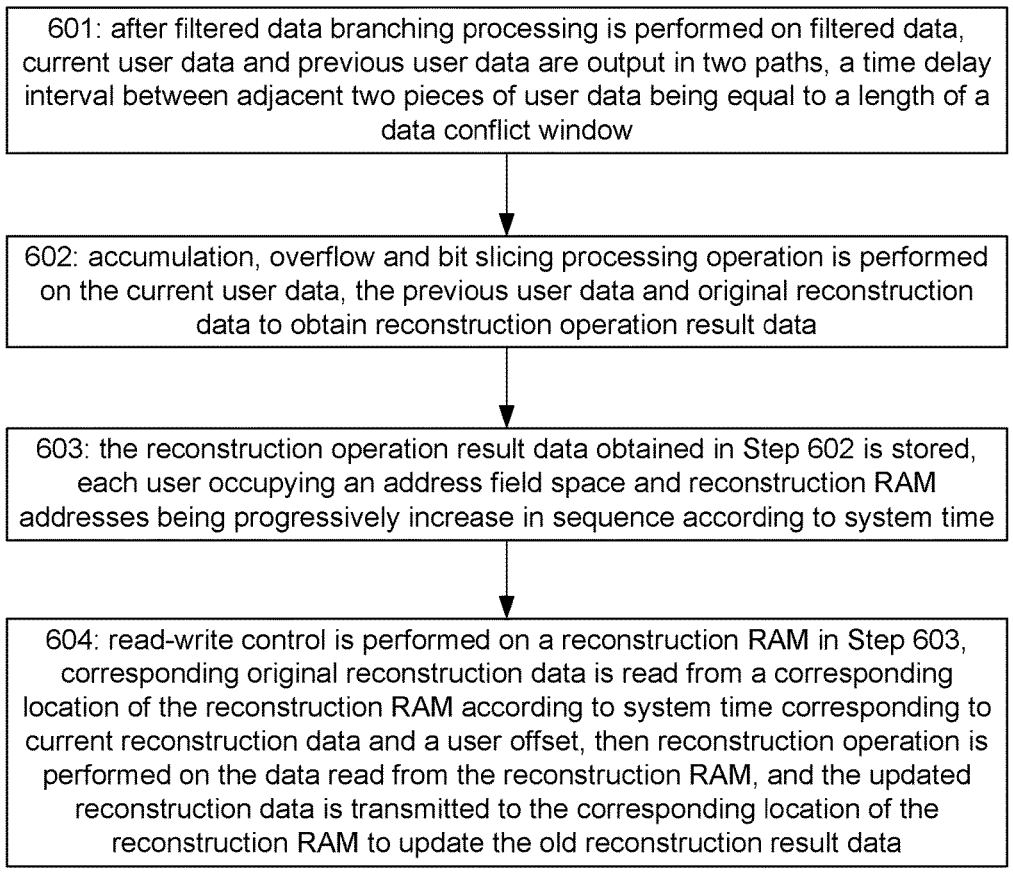
FIG. 6 is a flowchart of processing for resolving a reconstruction conflict according to an embodiment of the disclosure.

In a reconstruction accumulation process in Step 504, if adjacent users simultaneously write data into the same address in the RAM, a problem of data conflict may arise, and in the embodiment of the disclosure, a method capable of reducing control complexity and chip area cost consumption under the condition of maintaining maximum performance is adopted in the channel reconstruction process to solve the problem of data conflict of adjacent user data during reconstruction operation, and a specific processing flow is shown in FIG. 6.

FIG. 6 is a flowchart of processing for resolving a reconstruction conflict according to an embodiment of the disclosure, and as shown in FIG. 6, the processing flow for resolving the reconstruction conflict in the embodiment of the disclosure includes the following steps:

Step 601: after filtered data branching processing is performed on the filtered data, current user data and previous user data are output in two paths, a time delay interval between adjacent two pieces of user data being equal to a length of a data conflict window.

Step 602: accumulation, overflow and bit slicing processing operation is performed on the current user data, the previous user data and original reconstruction data to obtain reconstruction operation result data.

Here, operation for the adjacent users is to be executed in parallel, two paths of user data may be input sometimes, including the current user data and the previous user data, along with the original reconstruction data, and an operation unit is required to support addition operation of three paths of input.

Step 603: the reconstruction operation result data obtained in Step 602 is stored, each user occupying an address field space and reconstruction RAM addresses being progressively increase in sequence according to system time.

Step 604: read-write control is performed on the reconstruction RAM in Step 603, corresponding original reconstruction data is read from a corresponding location of the reconstruction RAM according to system time corresponding to current reconstruction data and a user offset, then reconstruction operation is performed on the data read from the reconstruction RAM, and the updated reconstruction data is transmitted to the corresponding location of the reconstruction RAM to update the old reconstruction result data.

Wherein, in Step 604, reconstruction operation over the data read from the reconstruction RAM is reconstruction operation over the original reconstruction data, and the updated reconstruction data is an output result of the reconstruction operation.

Figure 7:
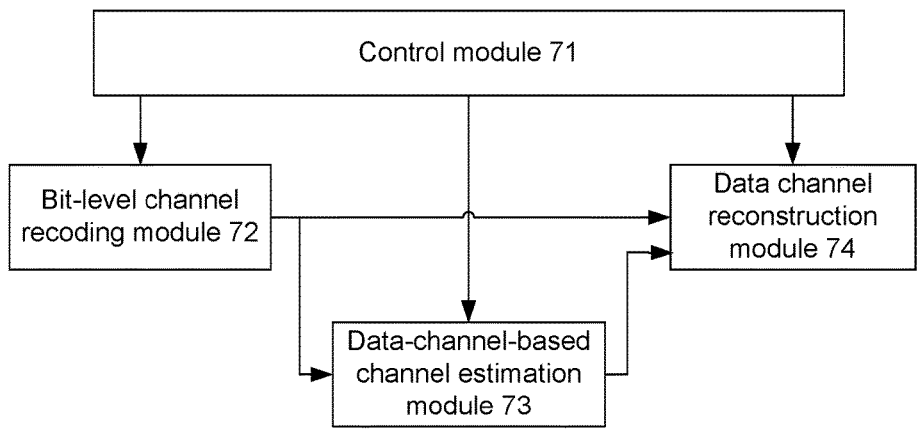
FIG. 7 is a structure diagram of a system for interference cancellation of a data channel according to an embodiment of the disclosure.

FIG. 7 is a structure diagram of a system for interference cancellation of a data channel according to an embodiment of the disclosure, and as shown in FIG. 7, the system for interference cancellation of the data channel in the disclosure includes: a control module 71, a bit-level channel recoding module 72, a data-channel-based channel estimation module 73 and a data channel reconstruction module 74, wherein the control module 71 is configured to control each functional module, and trigger and start the bit-level channel recoding module 72, the data-channel-based channel estimation module 73 and the data channel reconstruction module 74 to execute corresponding operations when it is necessary;

the bit-level channel recoding module 72 is configured to perform bit-level channel recoding on received transport block data, and send the obtained coded data to the data-channel-based channel estimation module 73 and the data channel reconstruction module 74;

the data-channel-based channel estimation module 73 is configured to perform channel estimation on the coded data and multiplexed antenna data of a data channel, and send obtained channel estimation data to the data channel reconstruction module 74; and the data channel reconstruction module 74 is configured to perform data channel reconstruction on the coded data with an RU as a unit by virtue of the channel estimation data, and the obtained reconstruction data is subtracted from the antenna data to implement interference cancellation, wherein, data channel reconstruction is implemented in a manner that the control module 71 controls the data channel reconstruction module 74 to preferably select a path with larger energy according to path energy.

In the embodiment of the disclosure, the control module 71 is further configured to transmit different frequency offset parameters to antennae forming an antenna pair.

Figure 8:
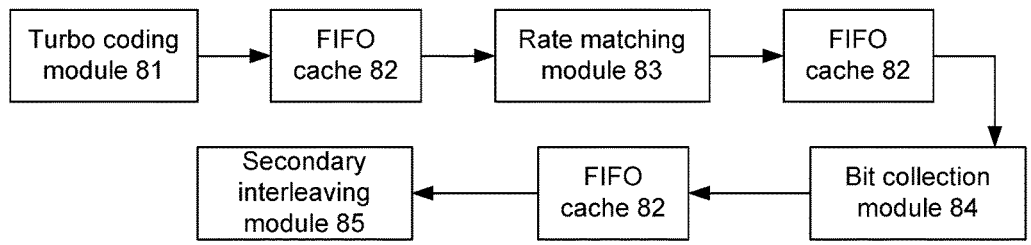
FIG. 8 is a structure diagram of a bit-level channel recoding module according to an embodiment of the disclosure.

FIG. 8 is a structure diagram of a bit-level channel recoding module according to an embodiment of the disclosure, and as shown in FIG. 8, the bit-level channel recoding module 72 in the disclosure includes: a Turbo coding module 81, multiple FIFO caches 82, a rate matching module 83, a bit collection module 84 and a secondary interleaving module 85, wherein the Turbo coding module 81 is configured to code the received transport block data to obtain Turbo coded data in a Turbo coding manner;

the multiple FIFO caches 82 are configured to cache the Turbo coded data, cache rate-matched data and cache bit-collected data; here, the FIFO caches 82 performs pipeline control by virtue of empty and full signals of the FIFO caches;

the rate matching module 83 is configured to match each bit and a transmission channel to confirm whether to repeat or punch;

the bit collection module 84 is configured to collect coded bit data;

the secondary interleaving module 85 is configured to perform secondary interleaving processing on the received FIFO cached data, and output the recoded data and interleaving addresses; and specific functions realized by the secondary interleaving module 85 in a secondary interleaving processing process include: performing row-column transform on an interleaving pattern, pre-calculating interleaving addresses where current coded data should be stored, outputting the bit-collected data, simultaneously writing the data into a RAM according to the calculated storage addresses, and sequentially reading the RAM to implement interleaving when the interleaved data is required.

The Turbo coding module 81, the rate matching module 83, the bit collection module 84 and the secondary interleaving module 85 internally adopt all-pipeline operation;

the multiple FIFO caches 82 are arranged between the Turbo coding module 81 and the rate matching module 83, between the rate matching module 83 and the bit collection module 84 and between the bit collection module 84 and the secondary interleaving module 85 respectively; the FIFO caches 82 adopt the empty and full signals of the FIFO caches for pipeline control, so as to improve a degree of coupling between the previous-stage and later-stage modules and implement all-pipeline bit-level channel recoding;

in the embodiment of the disclosure, the Turbo coding module 81 may be implemented by a Turbo coder during a practical application; the secondary interleaving module 85 may be implemented by an interleaver during the practical application; and the rate matching module 83 and the bit collection module 84 may be implemented by a CPU, a DSP, an FPGA or the like during the practical application.

Figure 9:
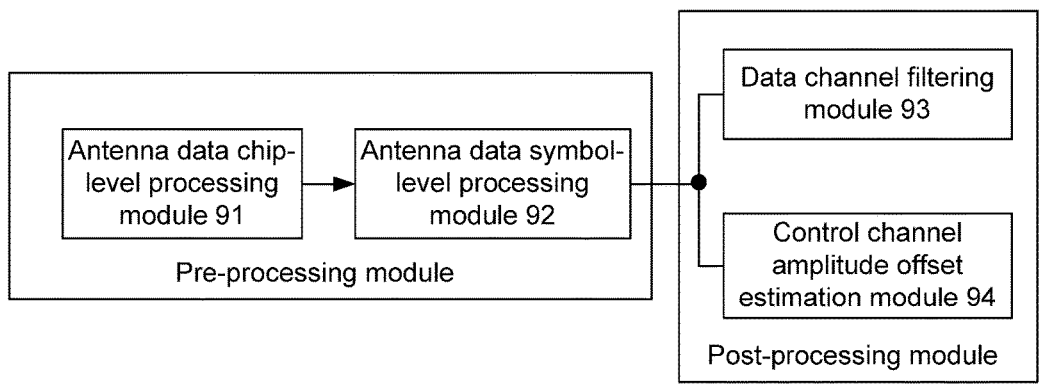
FIG. 9 is a structure diagram of a data-channel-based channel estimation module according to an embodiment of the disclosure.

FIG. 9 is a structure diagram of a data-channel-based channel estimation module according to an embodiment of the disclosure, the data-channel-based channel estimation module 73 mainly calculates a channel estimation value by multiplexing the antenna data of the data channel, and as shown in FIG. 9, the data-channel-based channel estimation module in the disclosure includes: an antenna data chip-level processing module 91, an antenna data symbol-level processing module 92, a data channel filtering module 93 and a control channel amplitude offset estimation module 94, wherein the antenna data chip-level processing module 91 and the antenna data symbol-level processing module 92 form a pre-processing module, and the data channel filtering module 93 and the control channel amplitude offset estimation module 94 form a post-processing module;

the antenna data chip-level processing module 91 is configured to receive a data packet parameter, request for antenna data after the data packet parameter is received, perform antenna data chip-level processing on the antenna data, and send the antenna data to the antenna data symbol-level processing module 92;

the antenna data symbol-level processing module 92 is configured to receive the data sent by the antenna data chip-level processing module 91, perform symbol-level processing on the data, and output the processed antenna data of the data channel and the processed antenna data of a control channel in parallel;

the data channel filtering module 93 is configured to perform real-time data channel filtering processing on the antenna data, output by the pre-processing module, of the data channel; and the control channel amplitude offset estimation module 94 is configured to, after a complete data packet is processed by the pre-processing module, start executing amplitude offset estimation on the control channel, read a filtering result of the data channel filtering module after an amplitude offset of the control channel is calculated, perform bit slicing processing to obtain a channel estimation value of the data channel, and multiply the obtained channel estimation value by the amplitude offset of the control channel to obtain a channel estimation value of the control channel.

Figure 10:
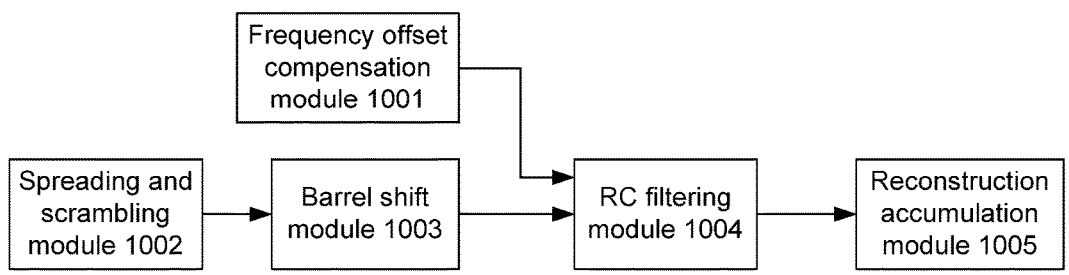
FIG. 10 is a structure diagram of a data channel reconstruction module according to an embodiment of the disclosure.

FIG. 10 is a structure diagram of a data channel reconstruction module according to an embodiment of the disclosure, and as shown in FIG. 10, the data channel reconstruction module in the disclosure includes: a frequency offset compensation module 1001, a spreading and scrambling module 1002, a barrel shift module 1003, an RC filtering module 1004 and a reconstruction accumulation module 1005, wherein the frequency offset compensation module 1001 is configured to perform frequency offset compensation processing on the channel estimation data, and establish a filtering coefficient to obtain data to be filtered;

the spreading and scrambling module 1002 is configured to perform spreading and scrambling processing on the coded data;

the barrel shift module 1003 is configured to perform barrel shift processing on the data processed by the spreading and scrambling module 1002 to obtain data to be filtered;

the RC filtering module 1004 is configured to perform RC filtering processing on the data to be filtered generated by the frequency offset compensation module 1001 and the barrel shift module 1003 to obtain filtered data; and the reconstruction accumulation module 1005 is configured to perform reconstruction accumulation on the filtered data generated by the RC filtering module 1004, and send the obtained reconstruction data to a downstream to be subtracted from the antenna data to implement the interference cancellation flow.

Figure 11:
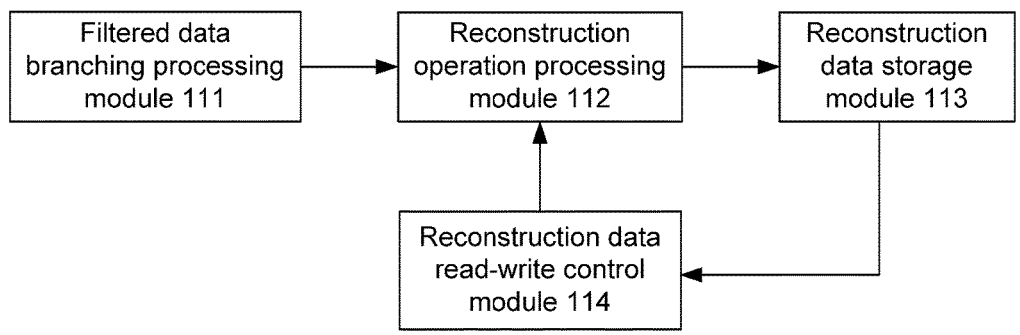
FIG. 11 is a structure diagram of a reconstruction accumulation module for resolving a reconstruction conflict according to an embodiment of the disclosure.

FIG. 11 is a structure diagram of a reconstruction accumulation module for resolving a reconstruction conflict according to an embodiment of the disclosure, the reconstruction accumulation module 1005 adopts a method capable of reducing control complexity and chip area cost consumption under the condition of maintaining maximum performance to resolve the reconstruction conflict for the problem of data conflict occurring when adjacent users simultaneously write data into the same address of the RAM, and as shown in FIG. 11, the reconstruction accumulation module 1005 for resolving the reconstruction conflict includes: a filtered data branching processing module 111, a reconstruction operation processing module 112, a reconstruction data storage module 113 and a reconstruction data read-write control module 114, wherein the filtered data branching processing module 111 is configured to receive the filtered data, and output current user data and previous user data in two paths, a time delay interval between adjacent two pieces of user data being equal to a length of a data conflict window;

the reconstruction operation processing module 112 is configured to execute reconstruction operation, and specifically perform related operation such as accumulation, overflow and bit slicing processing on the current user data, the previous user data and original reconstruction data to obtain reconstruction operation result data;

the reconstruction data storage module 113 is configured to store the reconstruction operation result data, each user occupying an address field space and reconstruction RAM addresses being progressively increase in sequence according to system time; and the reconstruction data read-write control module 114 is configured to perform read-write control on the reconstruction RAM, wherein read-write control over the reconstruction RAM includes that: corresponding original reconstruction data is read from a corresponding location of the reconstruction RAM according to system time corresponding to current reconstruction data and a user offset, then reconstruction operation is performed on the data read from the reconstruction RAM, and the updated reconstruction data is transmitted to the corresponding location of the reconstruction RAM to update the old reconstruction result data; and reconstruction operation over the data read from the reconstruction RAM is reconstruction operation over the original reconstruction data, and the updated reconstruction data is an output result of the reconstruction operation.

The above is only the preferred embodiment of the disclosure and not intended to limit the scope of protection of the disclosure.

INDUSTRIAL APPLICABILITY

According to the method and system for interference cancellation of the data channel provided by the embodiment of the disclosure, the whole interference cancellation flow including bit-level channel recoding, data-channel-based channel estimation and data channel reconstruction for interference cancellation of the WCDMA uplink dedicated data channel is involved, wherein the all-pipeline manner is adopted for the bit-level channel recoding process, so that coding efficiency reaches the optimal theoretical value. In the data-channel-based channel estimation process, the channel estimation value is calculated on the basis of the antenna data of the data channel, and channel estimation is performed by multiplexing the antenna data of the data channel, so that a utilization rate of a radio resource may be increased, the channel condition may be reflected more accurately, and calculation accuracy may be improved. In the data reconstruction process, the RU with a reasonable size is employed as a unit for reconstruction processing, and interference cancellation may directly be performed without waiting after an RU is reconstructed, so that cancellation efficiency may be greatly improved; moreover, the antennae forming the antenna pair have different frequency offset parameters, and the two antennae in the antenna pair may be separated, so that limits to the antenna pair are broken in the channel reconstruction process, and the antennae may be arranged in an arbitrary sequence, and are not required to be paired; the path with larger energy is preferably selected for reconstruction according to the path energy in the channel reconstruction process, and a path with energy smaller than specified energy is not reconstructed, so that application scenarios may be expanded, reconstruction cancellation benefits may be improved, and a utilization rate of a hardware resource may also be increased; and the method capable of reducing control complexity and chip area cost consumption under the condition of maintaining maximum performance is adopted in the channel reconstruction process, thereby solving the problem of data conflict of adjacent user data during reconstruction operation and further freely determining an antenna reconstruction sequence, and the antenna data here may be considered as an accumulated sum of multiple single-user energy waveforms.

What is claimed is:

1. A method for interference cancellation of a data channel, comprising:
    performing bit-level channel recording comprising bit collection on received transport block data, and then performing channel estimation on the recoded data and multiplexed antenna data of a data channel to obtain channel estimation data;
    performing data channel reconstruction on the recoded data with a Reconstruction Unit (RU) as a unit by virtue of the channel estimation data; and
    subtracting obtained reconstruction data from the antenna data to implement interference cancellation.

2. The method according to claim 1, further comprising: transmitting different frequency offset parameters to antennae forming an antenna pair.

3. The method according to claim 1, wherein the data channel reconstruction is implemented by: preferably selecting a path with larger energy for reconstruction according to path energy.

4. The method according to claim 1, wherein the bit-level channel recoding comprises:
    coding the received transport block data to obtain Turbo coded data in a Turbo coding manner; executing primary First-In First-Out (FIFO) caching on the Turbo coded data; performing rate matching on the primary cached data, and then executing secondary FIFO caching; performing bit collection on the secondary cached data, and then executing tertiary FIFO caching; and performing secondary interleaving processing on the tertiary cached data, and outputting the recoded data and interleaving addresses.

5. The method according to claim 4, wherein secondary interleaving processing comprises:
    performing row-column transform on an interleaving pattern at first, and calculating interleaving addresses where current coded data should be stored;
    outputting the bit-collected data, and writing the bit-collected data into a Random Access Memory (RAM) according to the calculated storage addresses; and when the interleaved data is required, sequentially reading the data stored in the RAM to implement interleaving.

6. The method according to claim 1, wherein performing channel estimation on the recoded data and the multiplexed antenna data of the data channel comprises:
receiving a data packet parameter, and requesting for antenna data after the data packet parameter is received; performing antenna data chip-level processing on the obtained antenna data, and then executing antenna data symbol-level processing; outputting the processed antenna data of the data channel and the processed antenna data of a control channel in parallel; performing real-time data channel filtering processing on the antenna data of the data channel;
after a complete data packet is received, starting amplitude offset estimation of the control channel; and after the amplitude offset of the control channel is calculated, reading a data channel filtering result, performing bit slicing processing to obtain a channel estimation value of the data channel, and multiplying the obtained channel estimation value by the amplitude offset of the control channel to obtain a channel estimation value of the control channel.

7. The method according to claim 1, when a reconstruction conflict occurs during data channel reconstruction, the method further comprising:
after performing filtered data branching processing on filtered data, outputting current user data and previous user data in two paths, a time delay interval between adjacent two pieces of user data being equal to a length of a data conflict window;
performing accumulation, overflow and bit slicing processing operation on the current user data, the previous user data and original reconstruction data to obtain reconstruction operation result data; and
storing the reconstruction operation result data, each user occupying an address field space and reconstruction RAM addresses being progressively increase in sequence according to system time.

8. The method according to claim 7, wherein read-write control over the reconstruction RAM comprises:
reading corresponding original reconstruction data from a corresponding location of the reconstruction RAM according to system time corresponding to current reconstruction data and a user offset; and performing reconstruction operation on the data read from the reconstruction RAM, and transmitting an updated reconstruction data to the corresponding location of the reconstruction RAM to update the original reconstruction data.

9. A system for interference cancellation of a data channel, comprising:
a processor; and
a memory configured to store instructions executable by the processor;
wherein the processor is configured to:
perform bit-level channel recoding comprising bit collection on received transport block data to obtain recoded data;
perform channel, estimation on the recoded data and multiplexed antenna data of a data channel to obtain channel estimation data; and
perform data channel reconstruction on the recoded data with a Reconstruction Unit (RU) as a unit by virtue of the channel estimation data, and subtract the obtained reconstruction data from the antenna data to implement interference cancellation.

10. The system according to claim 9, wherein the processor is further configured to transmit different frequency offset parameters to antennae forming an antenna pair.

11. The system according to claim 9, wherein when the processor is configured to perform the data channel reconstruction, the processor is configured to preferably selects a path with larger energy for reconstruction according to path energy.

12. The system according to claim 9, wherein when the processor is configured to perform bit-level channel recoding on the received transport block data to obtain recoded data, the processor is configured to:
code the received transport block data to obtain Turbo coded data in a Turbo coding manner;
cache the Turbo coded data, cache rate-matched data and cache bit-collected data in multiple FIFO caches;
match each bit and a transmission channel to confirm whether to repeat or punch;
collect coded bit data; and
perform secondary interleaving processing on received FIFO cached data, and output the recoded data and interleaving addresses.

13. The system according to claim 12, wherein when the processor is configured to perform secondary interleaving processing on the received FIFO cached data, and output the recoded data and interleaving addresses, the processor is configured to perform row-column transform on an interleaving pattern at first, pre-calculate interleaving addresses where current coded data should be stored, output the bit-collected data, simultaneously write the bit-collected data into a Random Access Memory (RAM) according to the calculated storage addresses, and sequentially read the RAM to implement interleaving when the interleaved data is required.

14. The system according to claim 9, wherein when the processor is configured to perform channel estimation on the recoded data and multiplexed antenna data of the data channel to obtain the channel estimation data, the processor is configured to:
receive a data packet parameter, request for antenna data after the data packet parameter is received, perform antenna data chip-level processing on the antenna data to obtain processed antenna data;
perform symbol-level processing on the processed antenna data to obtain processed antenna data of the data channel and the processed antenna data of a control channel in parallel;
perform real-time data channel filtering processing on the antenna data of the data channel; and
after a complete data packet is received, start amplitude offset estimation of the control channel, start executing amplitude offset estimation on the control channel, read a data channel filtering result after an amplitude offset of the control channel is calculated, perform bit slicing processing to obtain a channel estimation value of the data channel, and multiply the obtained channel estimation value by the amplitude offset of the control channel to obtain a channel estimation value of the control channel.

15. The system according to claim 9, wherein when the processor is configured to perform the data channel reconstruction, the processor is configured to:
receive filtered data, and output current user data and previous user data in two paths, a time delay interval between adjacent two pieces of user data being equal to a length of a data conflict window;

execute reconstruction operation, and specifically perform accumulation, overflow and bit slicing processing operation on the current user data, the previous user data and original reconstruction data to obtain reconstruction operation result data; and store the reconstruction operation result data in a reconstruction data storage, each user occupying an address field space and addresses of a reconstruction RAM being progressively increase in sequence according to system time.

16. The system according to claim 15, wherein the processor is configured to perform read-write control on the reconstruction RAM;

read-write control over the reconstruction RAM comprises: reading corresponding original reconstruction data from a corresponding location of the reconstruction RAM according to system time corresponding to current reconstruction data and a user offset; and then performing reconstruction operation on the data read from the reconstruction RAM, and transmitting an updated reconstruction data to the corresponding location of the reconstruction RAM to update the old reconstruction result data.

* * * * *